United States Patent
Toprac et al.

(10) Patent No.: US 6,346,426 B1
(45) Date of Patent: Feb. 12, 2002

(54) METHOD AND APPARATUS FOR CHARACTERIZING SEMICONDUCTOR DEVICE PERFORMANCE VARIATIONS BASED ON INDEPENDENT CRITICAL DIMENSION MEASUREMENTS

(75) Inventors: Anthony J. Toprac; Derick J. Wristers, both of Austin; Jon D. Cheek, Round Rock, all of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/716,181

(22) Filed: Nov. 17, 2000

(51) Int. Cl.$^7$ .............................................. H01L 21/00
(52) U.S. Cl. .............................................. 438/8; 73/105
(58) Field of Search ............................... 73/105; 430/5; 382/149, 154; 438/8; 250/310

(56) References Cited

U.S. PATENT DOCUMENTS

| | | | |
|---|---|---|---|
| 5,841,894 A | * 11/1998 | Horie | 382/154 |
| 6,000,281 A | * 12/1999 | Burke | 73/105 |
| 6,130,750 A | * 10/2000 | Ausschnitt | 356/401 |
| 6,200,708 B1 | * 3/2001 | Lai | 430/5 |
| 6,208,751 B1 | * 3/2001 | Almogy | 382/149 |
| 6,245,581 B1 | * 6/2001 | Bonser | 438/8 |
| 6,278,114 B1 | * 8/2001 | Mitsui | 250/310 |

* cited by examiner

Primary Examiner—John F. Niebling
Assistant Examiner—Andre C Stevenson

(74) Attorney, Agent, or Firm—William, Morgan & Amerson, P.C.

(57) ABSTRACT

A method for characterizing semiconductor device performance variations includes processing a wafer in a processing line to form a feature on the wafer; measuring a physical critical dimension of the feature in a first metrology tool to generate a first critical dimension measurement; measuring the physical critical dimension of the feature in a second metrology tool to generate a second critical dimension measurement independent of the first critical dimension measurement; determining an effective critical dimension of the feature in a third metrology tool to generate a third critical dimension measurement; and comparing the first, second, and third critical dimension measurements to identify a metrology drift in one of the first and second metrology tools. A system for characterizing semiconductor device performance variations includes a processing line, first, second, and third metrology tools, and a process controller. The processing line is adapted to process a wafer to form a feature on the wafer. The first metrology tool is adapted to measure a physical critical dimension of the feature to generate a first critical dimension measurement. The second metrology tool is adapted to measure the physical critical dimension of the feature to generate a second critical dimension measurement independent of the first critical dimension measurement. The third metrology tool adapted to determine an effective critical dimension of the feature to generate a third critical dimension measurement. The process controller is adapted to compare the first, second, and third critical dimension measurements to identify a metrology drift in one of the first and second metrology tools.

41 Claims, 3 Drawing Sheets

METHOD AND APPARATUS FOR
CHARACTERIZING SEMICONDUCTOR
DEVICE PERFORMANCE VARIATIONS
BASED ON INDEPENDENT CRITICAL
DIMENSION MEASUREMENTS

BACKGROUND OF THE INVENTION

1. Field of the Invention

This invention relates generally to the field of semiconductor processing and, more particularly, to a method and apparatus for characterizing semiconductor device performance variations based on independent critical dimension measurements.

2. Description of the Related Art

Semiconductor integrated circuit devices are employed in numerous applications, including microprocessors. Generally, the performance of a semiconductor device is dependent on both the density and the speed of the devices formed therein. A common element of a semiconductor device that has a great impact on its performance is a transistor. Design features, such as gate length and channel length, are being steadily decreased in order to achieve higher package densities and to improve device performance. The rapid advance of field effect transistor design has affected a large variety of activities in the field of electronics in which the transistors are operated in a binary switching mode. In particular, complex digital circuits, such as microprocessors and the like, demand fast-switching transistors. Accordingly, the distance between the drain region and the source region of a field effect transistor, commonly referred to as the channel length or gate length dimension, has been reduced to accelerate the formation of a conductive channel between a source and a drain electrode as soon as a switching gate voltage is applied and, moreover, to reduce the electrical resistance of the channel.

A transistor structure has been created where the longitudinal dimension of the transistor, commonly referred to as the width dimension, extends up to 20 $\mu$m, whereas the distance of the drain and source, i.e., the gate length, may be reduced down to 0.2 $\mu$m or less. As the gate length of the channel has been reduced to obtain the desired switching characteristic of the source-drain line, the length of the gate electrode is also reduced. Since the gate electrode is typically contacted at one end of its structure, the electrical charges have to be transported along the entire width of the gate electrode, i.e., up to 20 $\mu$m, to uniformly build up the transverse electric field that is necessary for forming the channel between the source and drain regions. Due to the small length of the gate electrode, which usually consists of a doped polycrystalline silicon, the electrical resistance of the gate electrode is relatively high, and it may cause high RC-delay time constants. Hence, the transverse electrical field necessary for fully opening the channel is delayed, thereby further deteriorating the switching time of the transistor line. As a consequence, the rise and fall times of the electrical signals are increased, and the operating frequency, i.e., the clock frequency, has to be selected so as to take into account the aforementioned signal performance.

In view of the foregoing, the control of the critical dimensions of the gate electrode is an increasingly important element of the fabrication process. If a gate electrode is formed overly large, its switching speed is compromised. On the other hand, if the gate electrode is formed too small, based on the design characteristics of the adjacent dielectric materials, the transistor will exhibit a higher leakage current, causing an excessive power usage and heat generation. Hence, its is important to control critical dimensions of a gate electrode such that the variation around a target gate electrode value is minimized.

One technique for reducing the gate electrode critical dimension variation is to perform post-etch metrology to determine the actual dimensions of the gate electrode after they are formed (i.e., typically by an anisotropic etching process). A scanning electron microscope is one tool suitable for gathering the metrology data. Based on the metrology information, the tools responsible for performing the previous steps in the fabrication process may be fine tuned to bring the actual dimensions closer to the target critical dimensions. For example, a photolithography stepper or an etch tool may be adjusted.

The metrology tools (e.g., scanning electron microscope) used to perform the critical dimension metrology are extremely sensitive. Accordingly, these tools are calibrated frequently, as much as several times per day. Even with such oversight, it is possible for the metrology tool to drift, thus resulting in a drift in the critical dimension measurements. This "metrology drift" causes perceived variations in the critical dimensions of the gate electrode independent of the "process drift" caused by variations introduced by the previous process steps. Often, metrology drifts may be incorrectly characterized as process drifts, and the previous processing tools may be adjusted to attempt to correct the drift.

Typically, the performance of the device is not tested until a number of processing steps after the gate electrode has been formed (i.e., typically after the first metal layer is formed). It is only at this point that the success of the previous process adjustments is evident. Electrical tests such as effective gate length and drive current determine the performance of the device. Adjusting the process based on errant deviations caused by metrology drifts may actually increase the variation in the gate electrode critical dimensions. For example, the errant metrology tool may improperly indicate that the gate electrodes are too large. The process may be adjusted to further reduce the gate electrode length, resulting in the formation of gate electrodes that are actually too small. When the devices reach the point where they can be electrically tested, they may have excessive leakage and perform poorly, depending on the magnitude of the errant length reduction.

The present invention is directed to overcoming, or at least reducing the effects of, one or more of the problems set forth above.

SUMMARY OF THE INVENTION

One aspect of the present invention is seen in a method for characterizing semiconductor device performance variations includes processing a wafer in a processing line to form a feature on the wafer; measuring a physical critical dimension of the feature in a first metrology tool to generate a first critical dimension measurement; measuring the physical critical dimension of the feature in a second metrology tool to generate a second critical dimension measurement independent of the first critical dimension measurement; determining an effective critical dimension of the feature in a third metrology tool to generate a third critical dimension measurement; and comparing the first, second, and third critical dimension measurements to identify a metrology drift in one of the first and second metrology tools.

Another aspect of the present invention is seen in a system for characterizing semiconductor device performance variations. The system includes a processing line, first, second, and third metrology tools, and a process controller. The processing line is adapted to process a wafer to form a feature on the wafer. The first metrology tool is adapted to measure a physical critical dimension of the feature to generate a first critical dimension measurement. The second metrology tool is adapted to measure the physical critical dimension of the feature to generate a second critical dimension measurement independent of the first critical dimension measurement. The third metrology tool adapted to determine an effective critical dimension of the feature to generate a third critical dimension measurement. The process controller is adapted to compare the first, second, and third critical dimension measurements to identify a metrology drift in one of the first and second metrology tools.

BRIEF DESCRIPTION OF THE DRAWINGS

The invention may be understood by reference to the following description taken in conjunction with the accompanying drawings, in which like reference numerals identify like elements, and in which.

Figure 1:
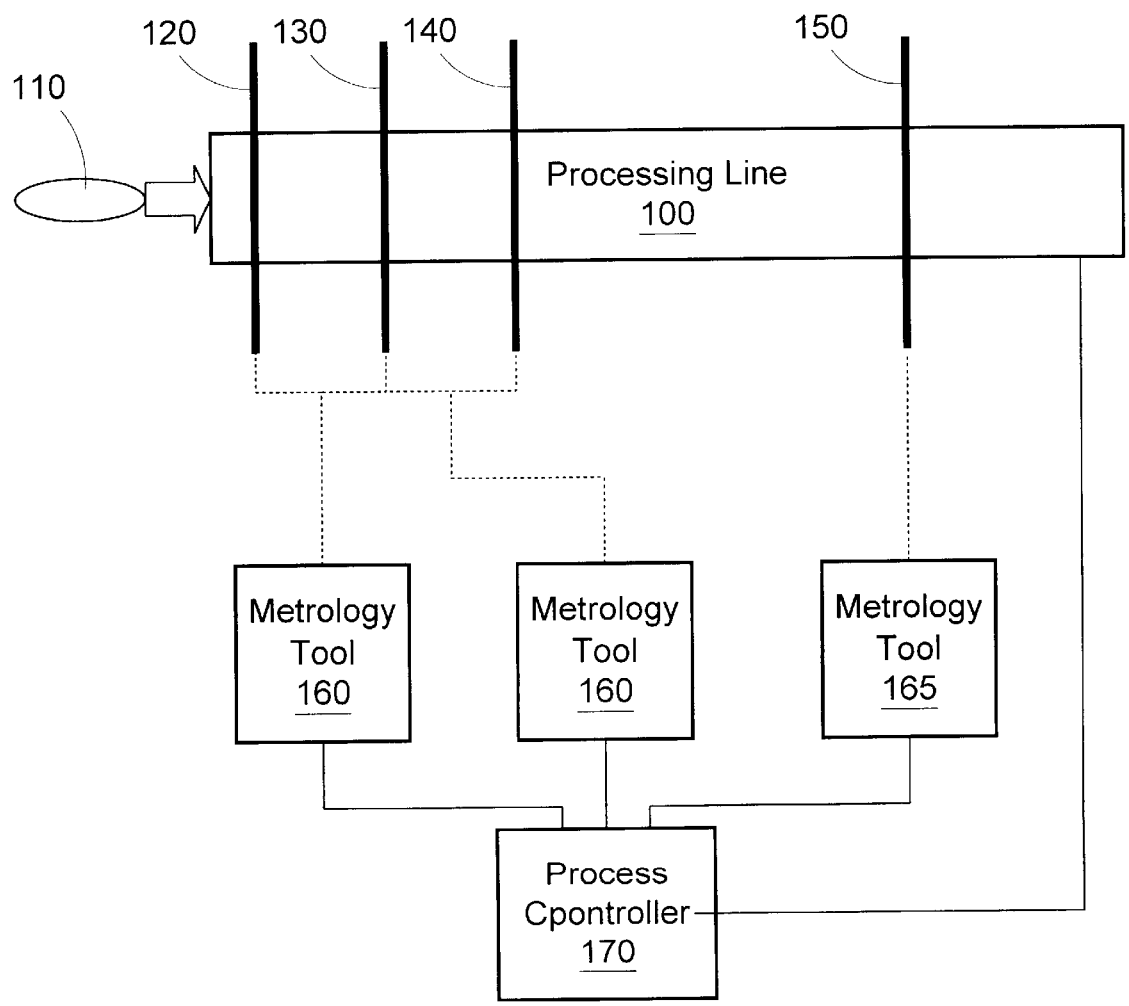
FIG. 1 is a simplified block diagram of a portion of an illustrative processing line for processing wafers in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to FIG. 1, a simplified block diagram of a portion of an illustrative processing line 100 for processing wafers 110 in accordance with one embodiment of the present invention is provided. The processing line 100 comprises a plurality of tools used in a process flow for forming features, such as transistors, on a semiconductor device. Exemplary tools typically included in the processing line 100 include photolithography steppers, deposition tools, polishing tools, annealing tools, implantation tools, etch tools, etc. The specific sequence of tools and processes performed by the tools are dependent on the specific features being formed. Those of ordinary skill in the art are familiar with the particular process flows and configurations, so for clarity and ease of illustration, they are not described in greater detail herein. Progress of the wafers 110 through the processing line 100 will be denoted qualitatively using enumerated lines. Line 120 represents the point in the processing line 100 where gate electrodes have been formed on the wafer 110. During the formation of the gate electrodes an anti-reflective coating (ARC) layer, such as silicon oxynitride (SiON), may be deposited over the polysilicon gate electrode material prior to etching to improve the efficacy of the photolithography process used to pattern the electrodes. Line 130 represents the point in the processing line 100 following the ARC layer removal. Line 140 represents the point in the processing line 100 after sidewall spacers have been formed adjacent the gate electrodes. Typically, after formation of the spacers, a series of implantation and annealing steps are performed to define the source/drain regions of the transistors. Subsequently, at line 150, a metal layer is formed and patterned to allow electrical contact with the gate electrode and source/drain regions. Normally, it is only after the metal layer is in place that electrical tests (e.g., effective channel length, gate drive current) may be performed on the wafers 110 to test their operating characteristics. These electrical measurements are useful in estimating the speed capabilities of the devices being formed.

A plurality of metrology tools 160, 165 are provided at various points in the processing line 100 to measure properties of the features being formed, including the critical dimensions of the gate electrodes. The specific locations of the metrology tools 160, 165 along the processing line 100 may vary depending on the specific implementation. A process controller 170 receives input from the metrology tools 160, 165 and performs process monitoring and/or process control functions. For example, the process controller 170 may automatically adjust the operating recipes of the various tools in the processing line 100 based on the metrology information.

In the illustrated embodiment, the process controller 170 is a computer programmed with software to implement the functions described. However, as will be appreciated by those of ordinary skill in the art, a hardware controller designed to implement the particular functions may also be used. Moreover, the functions performed by the process controller 170, as described herein, may be performed by multiple controller devices distributed throughout a system. Additionally, the process controller 170 may be a stand-alone controller or it may be part of a system controlling operations in an integrated circuit manufacturing facility. The process controller 170 may communicate with other entities in the processing line 100 using protocols and interfaces provided by the manufacturer. Alternatively, the process controller 170 may be connected to a larger network of controllers and communicate through an Advanced Process Control (APC) framework interface. For example, tools in the processing line 100 may be coupled to equipment interfaces (not shown) that retrieve data their associated entities and communicate this data to the Advanced Process Control (APC) framework. The equipment interfaces may receive control signals from the APC framework that may be used to control the entities.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the process controller 170 as described is the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

The process controller 170 is adapted to monitor the outputs of the metrology tools 160, 165 to distinguish between metrology drifts and process drifts in the critical dimension measurements. A metrology drift stems from a change in the characteristics of one of the metrology tools 160, 165 that cause it to provide errant measurements. A process drift, on the other hand, stems from a change in the characteristics of one of the processing tools in the processing line 100 that may occur due to a variety of reasons. For example, certain tools (e.g., deposition tools, polishing tools) employ consumable items that degrade over time. Measurements from the metrology tools 160, 165 may be used by the process controller 170 as the basis for changing operating recipes to account for the degradation.

The first step in identifying a drift, whether it be a metrology drift or a process drift, is to periodically take critical dimension measurements of the gate electrodes and monitor their proximity to each other or to a target value. In the illustrated embodiment, the process controller 170 tracks critical dimension measurements from three metrology tools 160, 165. The metrology tools 160 measure physical critical dimensions (e.g., gate electrode dimensions), and the metrology tool 165 measures a device performance characteristic (e.g., effective channel length, drive current) useful in determining an effective critical dimension.

An exemplary metrology tool 160 for measuring the physical critical dimensions is a scanning electron microscope, such as a KLA 8100 scanning electron microscope offered by KLA-Tencor Corporation or an Opal 7830 offered by Applied Materials, Inc. An exemplary metrology tool 165 for measuring a device performance characteristic useful in determining the effective critical dimension is an electrical parametric tester, such as an HP4070 offered by Hewlitt Packard Company coupled to a prober such as an EG4080 offered by Electroglas, Inc.

In the illustrated embodiment, the two metrology tools 160 that measure the physical critical dimensions both measure the dimensions of the gate electrodes after the removal of the ARC layer. However, it will be appreciated that the particular placement of the metrology tools 160 in the processing line 100 may vary, as indicated by the dashed lines. For example, one metrology tool 160 may measure the dimensions of the gate electrode after the etch process has been completed, but before the ARC layer is removed (i.e., if an ARC layer is employed). Alternatively, the metrology tool 160 may measure the gate electrode dimensions after the ARC layer has been removed. In still another variation, the critical dimensions may be measured after spacer formation. The device performance characteristic is measured by the metrology tools 165 after the formation of the metal layer. Techniques for measuring performance characteristics such as effective channel length and gate length are well known to those of ordinary skill in the art, and accordingly, they are not presented in greater detail herein.

The process controller 170 receives the critical dimension measurements and tracks the differences between one measurement and its counterparts. This difference is referred to herein as the delta CD. The process controller 170 calculates three delta CDs, one for each possible pairings of metrology tools 160, 165. Of course, other similar deviation comparisons may be made to achieve similar results. For example, each critical dimension measurement may be evaluated against a target critical dimension. The terms delta CD or CD deviation are intended to cover such alternative comparisons.

In the illustrated embodiment, the process controller 170 tracks the delta CDs using standard statistical process control (SPC) techniques, such as control charting. A single control chart that tracks all three delta CDs using the same set of control limits may be used. Alternatively, separate control charts with independent control limits may be used. The process controller 170 may track only control limit violations, referred to as a Rule 1 violation under the Western Electric SPC Rules. Alternatively, other rule violations may also be incorporated, such as two out of three consecutive measurements exceeding two standard deviations from the target on one side of the target (Rule 2), four out of five consecutive measurements exceeding one standard deviation from the target on one side of the target (Rule 3), and eight consecutive points on one side of the target (Rule 4). In the case where the delta CDs are computed relative to one another, the target may be zero (i.e., no deviation) or the target may be fixed at a characteristic value representing the normal offset between independent CD measuring tools performing a redundant measurement or at a value representing the normal offset in actual CDs at different measurement points in the process that are the result of normal operation of the process.

Depending on the particular delta CD or delta CDs triggering the rule violation, the nature of the drift may be determined. The following table illustrates the particular delta CD possibilities and their associated drift characterizations (i.e., metrology drift or process drift). For purposes of illustration, only single tool metrology drifts are considered (i.e., if one of the tools drifts, the other is assumed to be accurate). Tools 1 and 2 represent the metrology tools 160 taking the physical CD measurements, and Tool 3 represents the metrology tool 165 taking the effective CD measurement. The three potential delta CD combinations are denoted as Delta 1–3, Delta 2–3 and Delta 1–2.

TABLE 1

| Delta 1-3 | Delta 2-3 | Delta 1-2 | Drift Characterization |
|---|---|---|---|
| Steady | Drift | Drift | Metrology Drift - Tool 2 |
| Drift | Steady | Drift | Metrology Drift - Tool 1 |
| Drift | Drift | Steady | Process Drift |

Figure 2:
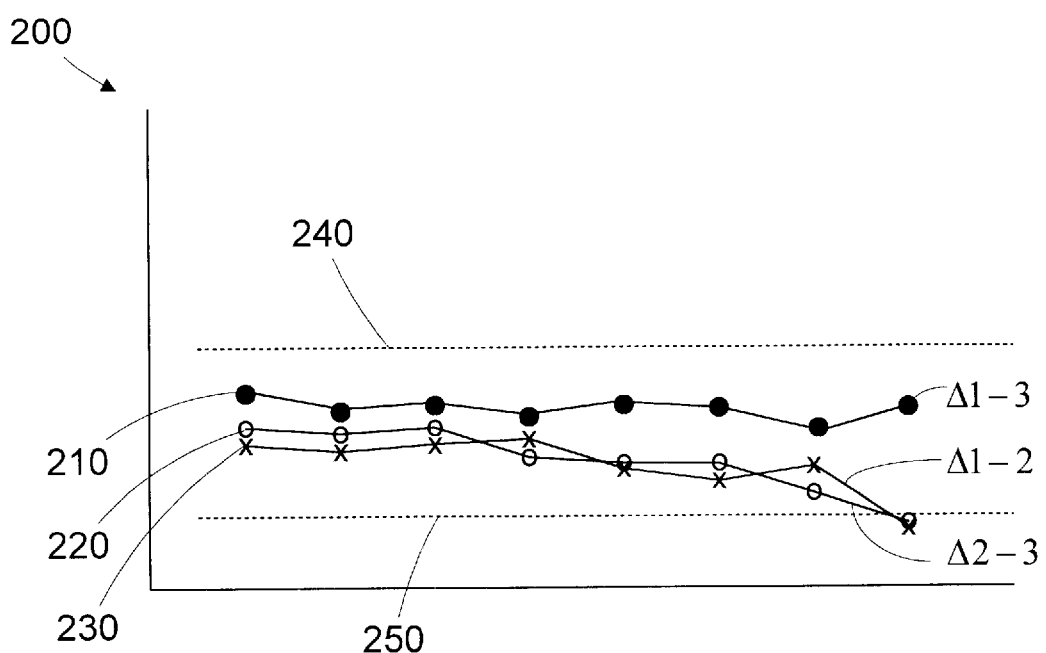
FIG. 2 is a control chart illustrating a technique for characterizing critical dimension drifts in the processing line of FIG. 1.

Referring now to FIG. 2, a control chart 200 illustrating a technique used by the process controller 170 for characterizing critical dimension drifts in the processing line of FIG. 1 is provided. Values for the three CD deviations (i.e., Delta 1–3, Delta 2–3, Delta 1–2) are illustrated by curves 210, 220, 230, respectively. A drift is signaled in response to one or more of the CD deviations exceeding one of an upper control limit 240 and a lower control limit 250. The case illustrated in FIG. 2 involves a metrology drift with Tool 2. Notice that the Delta 1–3 values remain steady, while the values for Delta 2–3 and Delta 1–2 drift.

In response to identifying a drift condition, the process controller 170 may take a variety of automatic actions. For example, if the drift is characterized as a metrology drift, the process controller may send a message to a centralized process control server (i.e., system responsible for overall process flow) to log the errant metrology tool 160 out of service . The process controller 170 may also sending an alert to an operator of the appropriate metrology tool 160. The message to the operator may include information regarding a needed calibration or maintenance procedure. In the case where a process drift has occurred, the process controller 170 may send a message to the centralized process control server to cease production on the affected portion of the processing line 100 until corrective actions may be completed. Alternatively, automatic messages may also be provided to individuals responsible for overall operation of the process to inform them of the process drift.

Figure 3:
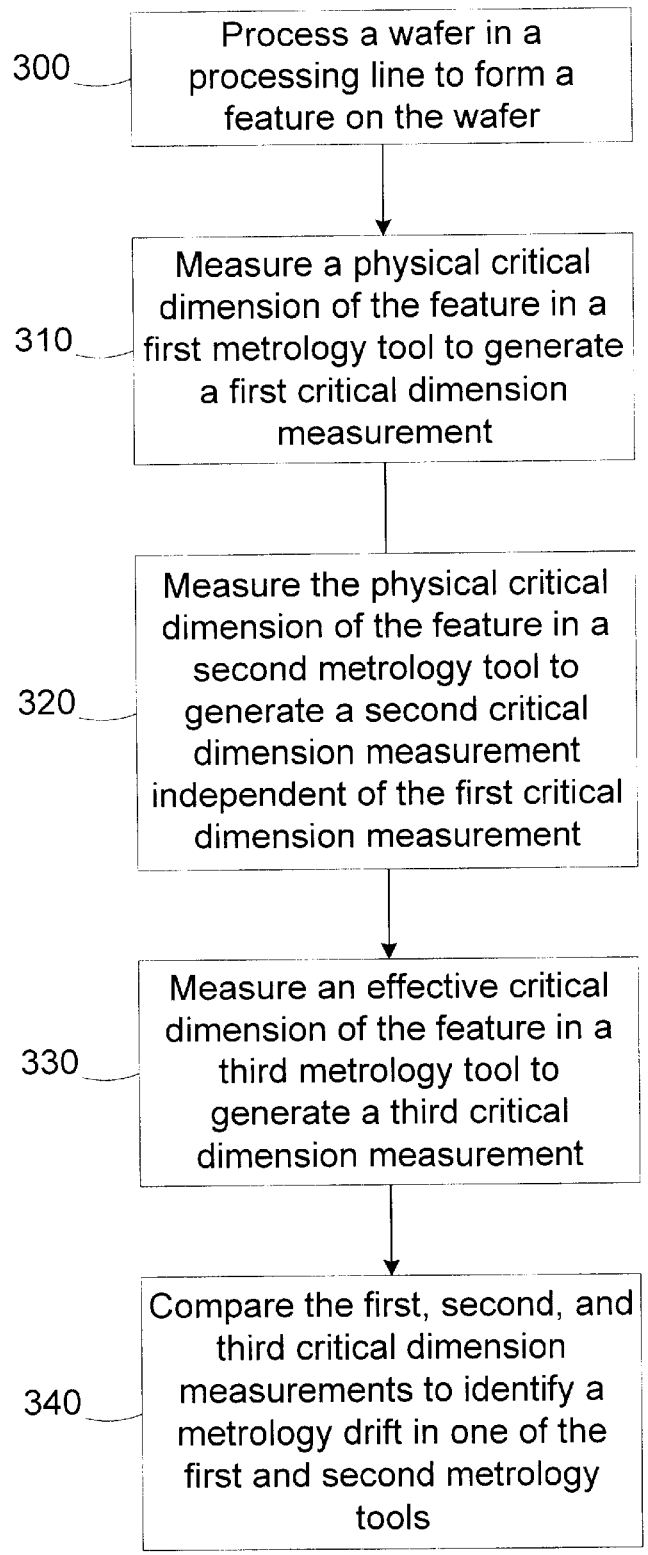
FIG. 3 is a simplified flow diagram of a method for identifying metrology drifts in a processing line in accordance with another embodiment of the present invention.

Turning now to FIG. 3, a simplified flow diagram of a method for identifying metrology drifts in accordance with another embodiment of the present invention is provided. In block 300, a wafer is processed in a processing line to form a feature on the wafer. In block 310, a physical critical dimension of the feature is measured in a first metrology tool to generate a first critical dimension measurement, and in block 320, the physical critical dimension of the feature is measured in a second metrology tool to generate a second critical dimension measurement independent of the first critical dimension measurement. In one illustrative embodiment, the first and second metrology tools may comprise scanning electron microscopes, and the physical critical dimension may comprise a dimension of a transistor gate electrode formed on the wafer. In block 330, an effective critical dimension of the feature is determined in a third metrology tool to generate a third critical dimension measurement. Determining the effective critical dimension may comprise measuring a drive current or an effective channel length of a transistor formed on the wafer. In block 340, the first, second, and third critical dimension measurements are compared to identify a metrology drift in one of the first and second metrology tools.

Characterizing drifts in the physical and effective critical dimensions of semiconductor device features, such as transistors, as described above, provides process owners and tool operators with automatic and timely information for correcting metrology problems or process problems that affect the performance of the semiconductor device. Such oversight allows drift problems to be identified and corrected more quickly, thus reducing the critical dimension variation seen on the final product and increasing the throughput of the processing line. Increased throughput and reduced variation lead directly to increased profitability.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for characterizing semiconductor device performance variations, comprising:

processing a wafer in a processing line to form a feature on the wafer;

measuring a physical critical dimension of the feature in a first metrology tool to generate a first critical dimension measurement;

measuring the physical critical dimension of the feature in a second metrology tool to generate a second critical dimension measurement independent of the first critical dimension measurement;

determining an effective critical dimension of the feature in a third metrology tool to generate a third critical dimension measurement; and comparing the first, second, and third critical dimension measurements to identify a metrology drift in one of the first and second metrology tools.

2. The method of claim 1, wherein comparing the first, second, and third critical dimension measurements comprises determining critical dimension deviations between each possible pairing of the first, second, and third critical dimension measurements.

3. The method of claim 2, further comprising comparing the critical dimension deviations to a control limit to identify the metrology drift.

4. The method of claim 2, further comprising:

determining a first critical dimension variation based on the difference between the first and third critical dimension measurements;

determining a second critical dimension variation based on the difference between the second and third critical dimension measurements; and determining a third critical dimension variation based on the difference between the first and second critical dimension measurements.

5. The method of claim 4, further comprising comparing the first, second, and third critical dimension deviations to a control limit to identify the metrology drift.

6. The method of claim 5, further comprising identifying the first metrology tool as having the metrology drift in response to the first and third critical dimension deviations violating the control limit and the second critical dimension deviation not violating the control limit.

7. The method of claim 5, further comprising identifying the second metrology tool as having the metrology drift in response to the second and third critical dimension deviations violating the control limit and the first critical dimension deviation not violating the control limit.

8. The method of claim 5, further comprising identifying a process drift in the processing line in response to the first and second critical dimension deviations violating the control limit and the third critical dimension deviation not violating the control limit.

9. The method of claim 1, wherein measuring the physical critical dimension of the feature in the first metrology tool comprises measuring the physical critical dimension of the feature in a scanning electron microscope.

10. The method of claim 1, wherein measuring the physical critical dimension of the feature in the second metrology tool comprises measuring the physical critical dimension of the feature in a scanning electron microscope.

11. The method of claim 1, wherein determining the effective critical dimension of the feature in the third metrology tool comprises determining the effective critical dimension of the feature in an electrical parametric tester.

12. The method of claim 1, wherein processing the wafer in the processing line comprises processing the wafer in the processing line to form a transistor having a gate electrode on the wafer.

13. The method of claim 12, wherein determining the effective critical dimension of the feature in the third metrology tool comprises measuring at least one of a drive current and an effective channel length of the transistor.

14. The method of claim 12, wherein measuring the physical critical dimension of the feature in the first metrology tool comprises measuring a dimension of the gate electrode.

15. The method of claim 12, wherein measuring the physical critical dimension of the feature in the second metrology tool comprises measuring a dimension of the gate electrode.

16. The method of claim 1, wherein measuring the physical critical dimension of the feature in the first and second metrology tools comprises measuring the physical critical dimension of the feature at a common point in the processing line.

17. The method of claim 1, wherein measuring the physical critical dimension of the feature in the first and second metrology tools comprises measuring the physical critical dimension of the feature at a different point in the processing line.

18. The method of claim 1, further comprising comparing the first, second, and third critical dimension measurements to identify a process drift in the processing line.

19. The method of claim 1, further comprising initiating an automatic corrective action in response to identifying the metrology drift.

20. The method of claim 19, wherein initiating the automatic corrective action includes sending an alert to a tool operator of the one of the first and second metrology tools associated with the metrology drift.

21. The method of claim 19, wherein initiating the automatic corrective action includes logging the one of the first and second metrology tools associated with the metrology drift out of service.

22. The method of claim 21, wherein logging the one of the first and second metrology tools associated with the metrology drift out of service includes sending a message to a process control server.

23. A method for identifying metrology drifts, comprising:

processing a wafer in a processing line to form a transistor having a gate electrode on the wafer;

measuring a physical critical dimension of the gate electrode in a first metrology tool to generate a first critical dimension measurement;

measuring the physical critical dimension of the gate electrode in a second metrology tool to generate a second critical dimension measurement independent of the first critical dimension measurement;

determining an effective critical dimension of the transistor in a third metrology tool to generate a third critical dimension measurement; and comparing the first, second, and third critical dimension measurements to identify a metrology drift in one of the first and second metrology tools.

24. The method of claim 23, wherein comparing the first, second, and third critical dimension measurements comprises determining critical dimension deviations between each possible pairing of the first, second, and third critical dimension measurements.

25. The method of claim 24, further comprising comparing the critical dimension deviations to a control limit to identify the metrology drift.

26. The method of claim 24, further comprising:

determining a first critical dimension variation based on the difference between the first and third critical dimension measurements;

determining a second critical dimension variation based on the difference between the second and third critical dimension measurements; and determining a third critical dimension variation based on the difference between the first and second critical dimension measurements.

27. The method of claim 26, further comprising comparing the first, second, and third critical dimension deviations to a control limit to identify the metrology drift.

28. The method of claim 27, further comprising identifying the first metrology tool as having the metrology drift in response to the first and third critical dimension deviations violating the control limit and the second critical dimension deviation not violating the control limit.

29. The method of claim 27, further comprising identifying the second metrology tool as having the metrology drift in response to the second and third critical dimension deviations violating the control limit and the first critical dimension deviation not violating the control limit.

30. The method of claim 27, further comprising identifying a process drift in the processing line in response to the first and second critical dimension deviations violating the control limit and the third critical dimension deviation not violating the control limit.

31. The method of claim 23, wherein measuring the physical critical dimension of the gate electrode in the first metrology tool comprises measuring the physical critical dimension of the gate electrode in a scanning electron microscope.

32. The method of claim 23, wherein measuring the physical critical dimension of the gate electrode in the second metrology tool comprises measuring the physical critical dimension of the gate electrode in a scanning electron microscope.

33. The method of claim 23, wherein measuring the effective critical dimension of the transistor in the third metrology tool comprises measuring the effective critical dimension of the transistor in an electrical parametric tester.

34. The method of claim 23, wherein measuring the effective critical dimension of the transistor in the third metrology tool comprises measuring at least one of a drive current and an effective channel length of the transistor.

35. The method of claim 23, wherein measuring the physical critical dimension in the first and second metrology tools comprises measuring the physical critical dimension at a common point in the processing line.

36. The method of claim 23, wherein measuring the physical critical dimension in the first and second metrology tools comprises measuring the physical critical dimension at a different point in the processing line.

37. The method of claim 23, further comprising comparing the first, second, and third critical dimension measurements to identify a process drift in the processing line.

38. The method of claim 23, further comprising initiating an automatic corrective action in response to identifying the metrology drift.

39. The method of claim 38, wherein initiating the automatic corrective action includes sending an alert to a tool operator of the one of the first and second metrology tools associated with the metrology drift.

40. The method of claim 38, wherein initiating the automatic corrective action includes logging the one of the first and second metrology tools associated with the metrology drift out of service.

41. The method of claim 40, wherein logging the one of the first and second metrology tools associated with the metrology drift out of service includes sending a message to a process control server.

\* \* \* \* \*